United States Patent
Filar

(10) Patent No.: US 8,460,462 B2
(45) Date of Patent: Jun. 11, 2013

(54) METHOD AND AN APPARATUS FOR GROWING A SILICON SINGLE CRYSTAL FROM A MELT

(75) Inventor: Piotr Filar, Burghausen (DE)

(73) Assignee: Siltronic AG, Munich (DE)

( * ) Notice: Subject to any disclaimer, the term of this patent is extended or adjusted under 35 U.S.C. 154(b) by 390 days.

(21) Appl. No.: 12/765,896

(22) Filed: Apr. 23, 2010

(65) Prior Publication Data

US 2010/0288185 A1    Nov. 18, 2010

(30) Foreign Application Priority Data

May 13, 2009   (EP) .................................. 09006477

(51) Int. Cl.
```
C30B 15/00    (2006.01)
C30B 21/06    (2006.01)
C30B 27/02    (2006.01)
C30B 28/10    (2006.01)
C30B 30/04    (2006.01)
C30B 13/28    (2006.01)
```
(52) U.S. Cl.
CPC .................. *C30B 15/00* (2013.01); *C30B 21/06* (2013.01); *C30B 27/02* (2013.01); *C30B 28/10* (2013.01); *C30B 30/04* (2013.01); *C30B 13/28* (2013.01)
USPC .................. 117/13; 117/15; 117/20; 117/32; 117/39; 117/59; 117/73; 117/202; 117/217

(58) Field of Classification Search
CPC ....................................................... C30B 15/00
USPC ............... 117/13, 217, 15, 20, 32, 39, 59, 73, 117/202
See application file for complete search history.

(56) References Cited

U.S. PATENT DOCUMENTS

| | | | | |
|---|---|---|---|---|
| 5,004,519 A * | 4/1991 | Hariri | ............................... | 117/30 |
| 5,394,825 A | 3/1995 | Schmid et al. | | |
| 5,578,123 A | 11/1996 | Vilzmann et al. | | |
| 6,423,285 B1 | 7/2002 | Itoi et al. | | |
| 2008/0060572 A1* | 3/2008 | Fu et al. | ............................ | 117/32 |
| 2008/0302294 A1* | 12/2008 | Ohkubo | ............................ | 117/13 |

FOREIGN PATENT DOCUMENTS

| | | | |
|---|---|---|---|
| EP | 0745706 A1 | | 12/1996 |
| JP | 08-225397 A | | 9/1996 |
| JP | 09208385 A | * | 8/1997 |
| JP | 10-167891 A | | 6/1998 |
| JP | 11-139899 A | | 5/1999 |
| JP | 11139899 A | * | 5/1999 |
| JP | 2000-26484 A | | 9/2000 |
| JP | 2001-002492 A | | 1/2001 |
| JP | 2002-97097 A | | 4/2002 |
| JP | 2004196569 A | * | 7/2004 |

* cited by examiner

*Primary Examiner* — Michael Kornakov
*Assistant Examiner* — Hua Qi
(74) *Attorney, Agent, or Firm* — Brooks Kushman P.C.

(57) ABSTRACT

Silicon single crystals are grown from the melt by providing the melt in a crucible; imposing a horizontal magnetic field on the melt; directing a gas between the single crystal and a heat shield to a melt free surface, and controlling the gas to flow over a region of the melt free surface extending in a direction substantially perpendicular to the magnetic induction. A suitable apparatus has a crucible for holding the melt; a heat shield surrounding the silicon single crystal having a lower end which is connected to a bottom cover facing a melt free surface and a non-axisymmetric shape with respect to a crucible axis, such that gas which is directed between the crystal and the heat shield to the melt free surface is forced to flow over a region of the melt which extends substantially perpendicular to the magnetic induction.

8 Claims, 6 Drawing Sheets

METHOD AND AN APPARATUS FOR GROWING A SILICON SINGLE CRYSTAL FROM A MELT

CROSS-REFERENCE TO RELATED APPLICATIONS

This application claims priority to European Patent Application No. EP 09006477 filed May 13, 2009 which is herein incorporated by reference.

BACKGROUND OF THE INVENTION

1. Field of the Invention

The present disclosure relates to a method and an apparatus for growing a silicon single crystal from a melt. More specifically, it relates to a method for growing a silicon single crystal according to the Czochralski method while imposing a horizontal magnetic field on the melt, the so-called HMCZ method.

2. Background Art

It is known, e.g. from EP 0 745 706 A1, that imposing a horizontal magnetic field on the melt reduces melt convection and the dissolution of SiO from the crucible. As a consequence, imposing a horizontal magnetic field on the melt is a suitable strategy for producing silicon single crystals having a relatively low oxygen concentration.

It is further known that the oxygen concentration in a silicon single crystal can be lowered by increasing the flow rate of inert gas flowing between the silicon single crystal and a heat shield to a melt free surface. The increased gas flow rate enhances the transport of SiO evaporating from the melt so that less oxygen is incorporated in the growing silicon single crystal.

JP2004-196569 A discloses an HMCZ method comprising simultaneously controlling the axial position of the horizontal magnetic field and the intensity of the gas flow in order to produce low-oxygen silicon single crystals. However, controlling the axial position of the horizontal magnetic field requires a complex control system.

SUMMARY

It is an object of the present invention to provide a method which is suitable to produce low-oxygen silicon single crystals and which requires minor efforts for controlling the oxygen concentration. These and other objects are achieved by a method for growing a silicon single crystal from a melt, comprising providing the melt in a crucible; imposing a horizontal magnetic field on the melt having a magnetic induction B at a field center C; directing a gas between the silicon single crystal and a heat shield to a melt free surface, and controlling the gas to flow over a region of the melt free surface which extends in a direction substantially perpendicular to the magnetic induction B. The objects are further achieved by an apparatus for growing a silicon single crystal from a melt, comprising a crucible for holding the melt; a magnetic system imposing a horizontal magnetic field on the melt, the magnetic field having a magnetic induction B at a field center C; a heat shield surrounding the silicon single crystal, the heat shield having a lower end which is connected to a bottom cover facing a melt free surface and having a non-axisymmetric shape with respect to a crucible axis M, such that a gas which is directed between the silicon single crystal and the heat shield to the melt free surface is forced by the bottom cover to flow over a region of the melt free surface which extends in a direction substantially perpendicular to the magnetic induction B.

DETAILED DESCRIPTION OF THE PREFERRED EMBODIMENTS

Figure 1:
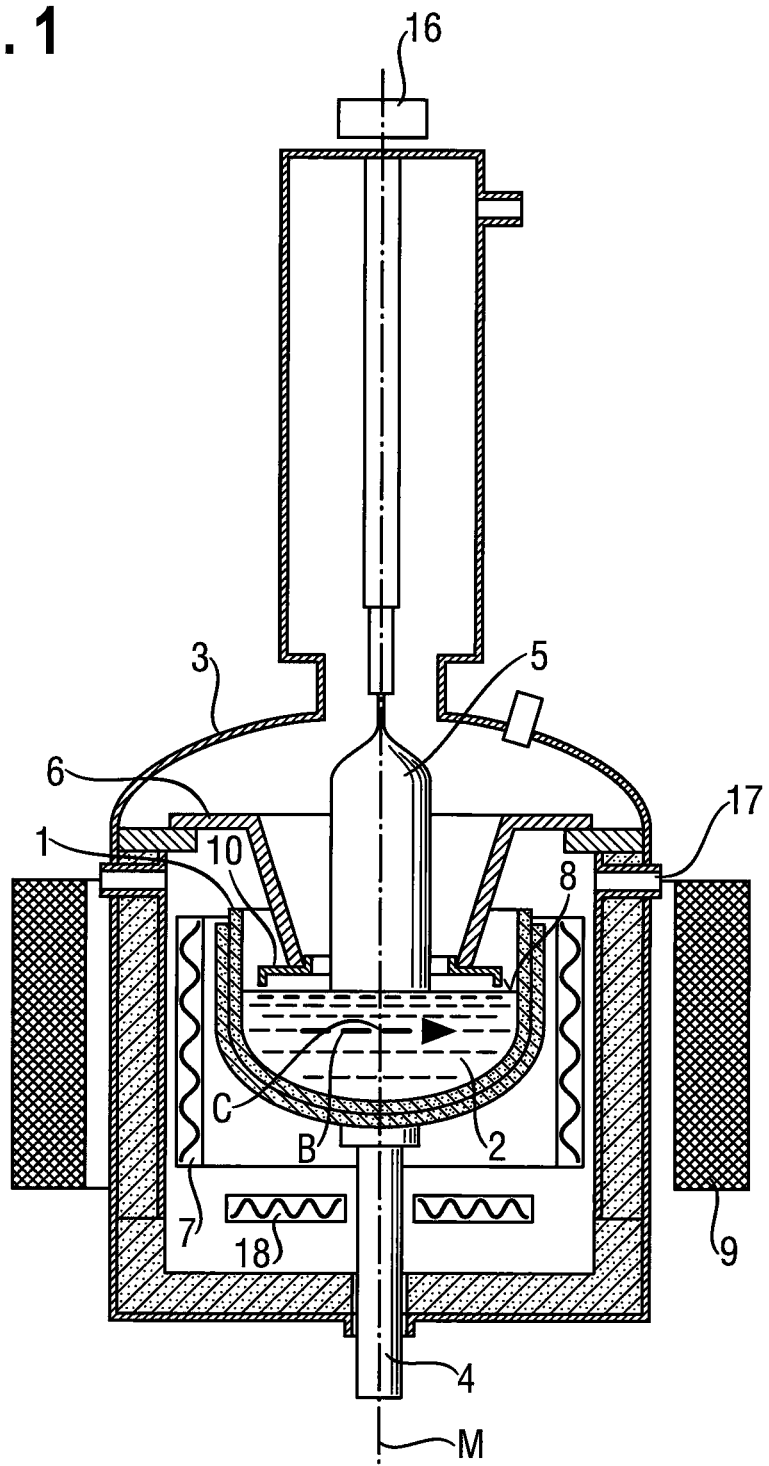
FIG. 1 is a diagrammatic cross-sectional view showing typical features of a furnace suitable for growing silicon single crystals according to the HMCZ method and features of the claimed invention.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

By using the present invention it is possible to grow silicon single crystals with an oxygen concentration of less than $5 \cdot 10^7$ atoms/cm$^3$ (according to new ASTM) in at least more than 50% of the length of the cylindrical part of the silicon single crystal, preferably at least more than 70% and most preferably more than at least 80%.

The horizontal magnetic field which is imposed on the melt suppresses thermal convection in the melt mainly in a part of the melt which extends parallel to the magnetic induction B. According to the present invention, a gas which is directed to the melt free surface is forced to flow over a region of the melt free surface where the evaporation of SiO from the melt is enhanced due to thermal convection which is not suppressed by the horizontal magnetic field. Controlling of the gas to flow over this region of the melt free surface increases the removal of SiO and significantly reduces the oxygen concentration in the melt and the silicon single crystal.

According to another aspect, the invention also provides a solution for reducing the consumption of inert gas which is needed for controlling the oxygen concentration in silicon single crystals having large diameters like 300 mm, 450 mm or more. Conventionally, the flow rate of inert gas which is needed to achieve a target concentration of oxygen in the grown silicon single crystal depends on the diameter of the single crystal. For example, a higher flow rate of argon is needed to maintain a certain oxygen concentration in a silicon single crystal having a diameter of 300 mm compared to the flow rate which is necessary to maintain the same oxygen concentration in a single crystal having a diameter of 200 mm. For technical reasons like insufficient pump and vacuum systems it becomes more and more difficult to provide the required gas flow, if silicon single crystals having diameters of more than 300 mm have to be pulled in a conventional manner. However, by performing the method according to present invention such difficulties can be avoided since a lower flow of inert gas is needed for achieving a certain oxygen target concentration in the single crystal compared to the flow rate needed for achieving the same oxygen target concentration by performing a conventional method.

The horizontal magnetic field is commonly generated by means of a magnetic system comprising several coils which are arranged symmetrically (with respect to a crucible axis M) around the crucible. The field center C defined in accordance with the claimed invention is the intersection of a horizontal plane dividing the coils into halves and axis M of the crucible. The magnetic induction B represents the magnetic induction of the horizontal magnetic field at the field center C.

FIG. 1 is a diagrammatic cross-sectional view showing typical features of a furnace suitable for growing silicon single crystals according to the HMCZ method and features of the claimed invention.

A crucible 1 holding a melt 2 is arranged within a housing 3 and rests on a lifting shaft 4. A single crystal 5 is pulled from the melt by a pulling mechanism 16 while a horizontal magnetic field is imposed on the melt. A heat shield 6 surrounding the single crystal is provided to protect the crystal from heat radiation radiated from a side heater 7 which is disposed around the crucible 1. According to a preferable embodiment a further heater 18 is disposed under the crucible. The housing is steadily purged with a gas entering the housing by a gas inlet and exiting the housing by a number of gas exhaust openings 17. The gas is directed between the single crystal and the heat shield to a melt free surface 8 and further driven from the melt free surface between the heat shield and the crucible wall to the gas exhaust openings 17. The gas is preferably directed between the silicon single crystal and the heat shield to the melt free surface in a non-axisymmetric way with respect to the center axis M. The magnetic field is generated by coils 9 which are symmetrically arranged around the crucible. The field center C of the horizontal magnetic field is represented by the intersection of a horizontal plane dividing the coils into halves and a center axis M of the crucible. The magnetic induction at the field center is represented by the magnetic induction B. In accordance with the present invention the heat shield 6 comprises a bottom cover 10 which is connected, e.g. fixed by screws, to the lower end of the heat shield and faces the melt free surface 8. The bottom cover is non-axisymmetric with respect to the center axis M of the crucible and serves as a tool for controlling the gas to flow over a region of the melt free surface which extends in a direction substantially perpendicular to the magnetic induction B, i.e. as a tool for controlling the gas to flow over the melt free surface in a non-axisymmetric way with respect to the center axis M. According to a preferred embodiment of the invention, the heat shield is attached to a support in a manner which enables turning of the heat shield. Turning the heat shield and the bottom cover which is connected thereto allows to more precisely control the gas flowing over the region of the melt free surface. Turning the heat shield to the left (right) will direct the gas flow to the left (right) of the region. It is also preferred that the exhaust openings 17 are disposed in a non-axisymmetric manner with respect to the crucible axis M in order to promote the gas flowing over the region of the melt free surface which extends in a direction substantially perpendicular to the magnetic induction B.

Figure 2:
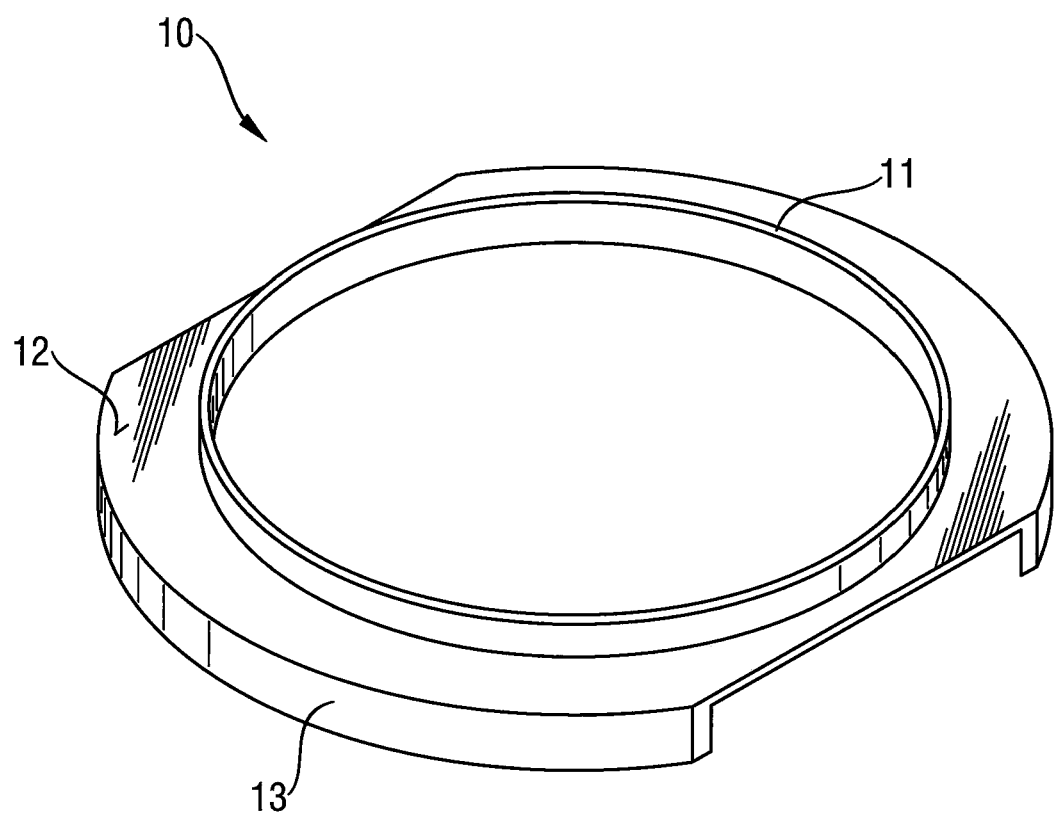
FIG. 2 depicts the bottom cover according to a preferred embodiment.

FIG. 2 depicts the bottom cover according to a preferred embodiment. The bottom cover comprises a ring section 11, a brim section 12 and a collar section 13. The brim section can be flat or convexly or concavely bent. The ring has an inner diameter which is sufficiently large so that the silicon single crystal can be pulled through. The brim section extends horizontally from the ring and the collar section is connected to the outer edge of the brim section and extends vertically towards the melt.

Figure 3:
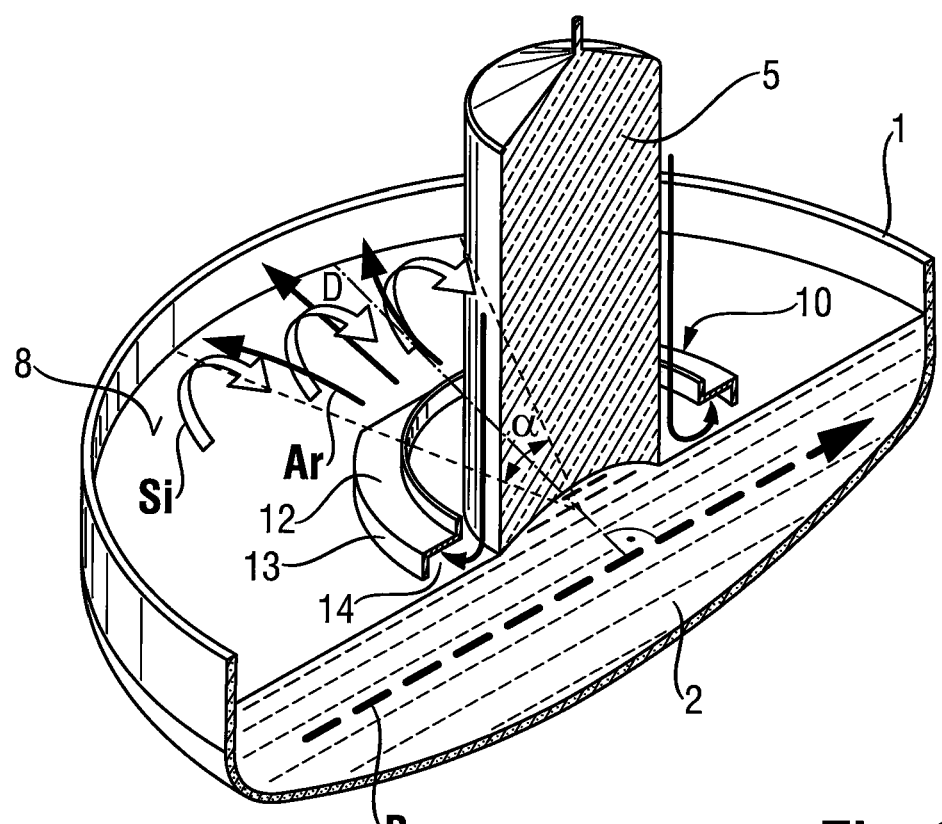
FIG. 3 is a cross-sectional view of FIG. 4 and represents an axial cut through the single crystal in a direction parallel to the direction of the magnetic induction B.
Figure 4:
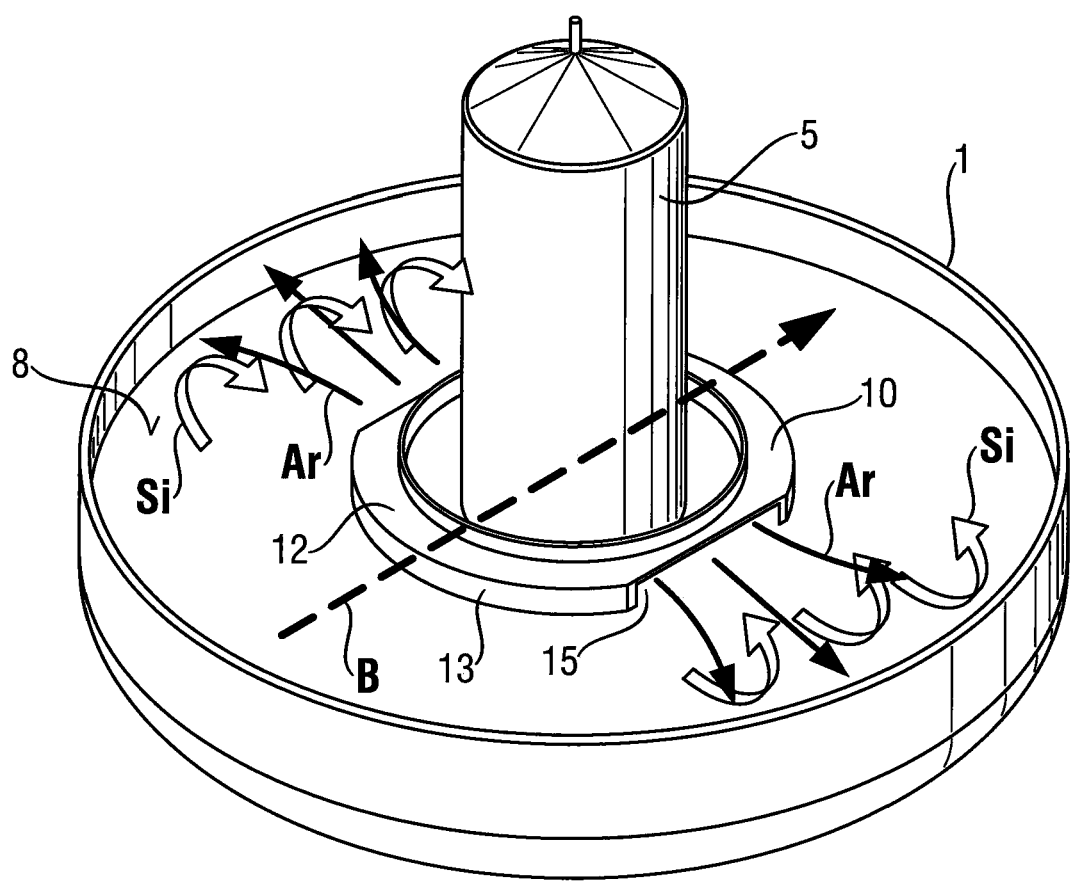
FIG. 4 illustrates a three-dimensional view of a furnace in accordance with FIG. 1.
Figure 5:
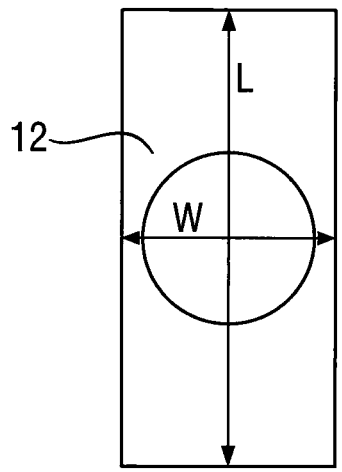
FIG. 5 illustrates the shape of the brim section according to preferred embodiments and may have a shape which is rectangular.
Figure 6:
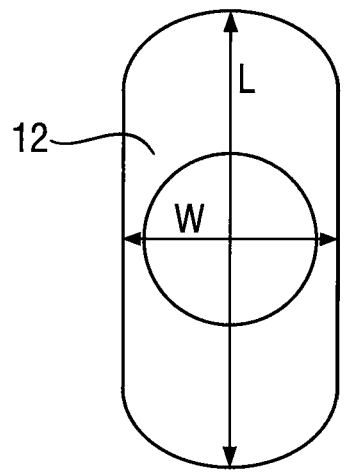
FIG. 6 illustrates the shape of the brim section according to preferred embodiments and may have a shape of a rectangle having rounded ends.
Figure 7:
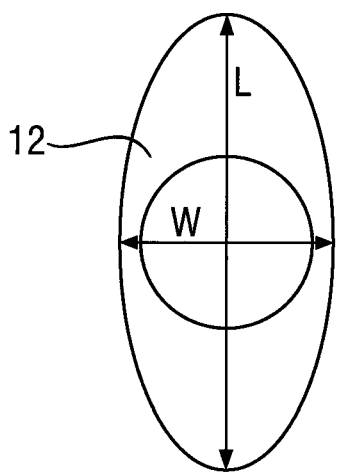
FIG. 7 illustrates the shape of the brim section according to preferred embodiments and may have a shape which is elliptical.

The effect of the invention is further explained by referring to FIGS. 3 and 4, wherein FIG. 3 is a cross-sectional view of FIG. 4 and represents an axial cut through the single crystal in a direction parallel to the direction of the magnetic induction B. Mainly the single crystal 5, the crucible 1, the melt 2 and the bottom cover 10 are shown. Arrows "Si" depict the direction of the melt convection. Arrows "Ar" depict the direction of the flow of a gas, e.g. an inert gas like argon, which is initially directed between the heat shield (not shown) and the single crystal to the melt free surface 8.

The bottom cover 10 is non-axisymmetrically shaped such that the gas which is directed between the single crystal and the heat shield to the melt free surface is forced to flow over a region of the melt free surface which extends in a direction substantially perpendicular to the magnetic induction B. In this region, the evaporation rate of SiO is enhanced since thermal convection "Si" in the melt is less influenced by the horizontal magnetic field and the gas flow "Ar" readily removes SiO evaporating from the melt in this region.

The region preferably extends over a sector of the melt free surface having a center angle α which is not less than 45° and not more than 135°, wherein the center axis D of the sector is aligned perpendicular to the magnetic induction B or, due to the influence of crucible rotation, is directed in a direction deviating up to −30° or +30° from the perpendicular alignment.

The brim section 12, the collar section 13, the melt free surface 8 and the silicon single crystal 5 form the boundaries of a channel 14 which controls the gas to flow along the inner wall of the collar section towards an opening 15 in the collar section. The bottom cover is disposed such that the gas exiting the opening flows over the region of the melt free surface which extends in a direction substantially perpendicular to the magnetic induction B. The brim section 12 and the collar section 13 are shaped preferably to extend transversely to the magnetic induction B. This enables the gas flowing between the melt surface and the brim section with enhanced velocity and further improves the removal rate of SiO from the melt.

Figure 8:
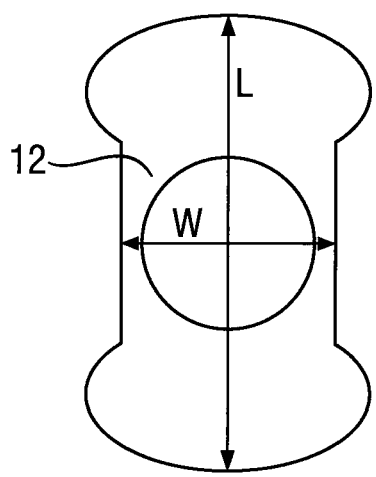
FIG. 8 illustrates the shape of the brim section according to preferred embodiments and may have ends which are elliptically broadened.

FIGS. 5 to 8 show the shape of the brim section according to preferred embodiments. The brim section may have a shape which is rectangular (FIG. 5) or elliptical (FIG. 7) or may have the shape of a rectangle having rounded ends (FIG. 6) or ends which are elliptically broadened (FIG. 8). These particular shapes are not limiting. In case the brim section is enlarged transversely to the magnetic induction B, the ratio L/W of the length L and the width W of the brim section preferably satisfies the formula: $1.1<L/W<3.0$. The length L and the width W intersect in the center of the ring 11.

The bottom cover is preferably designed in a way to keep the influence of the bottom cover on the axial temperature gradient at the growth interface of the silicon single crystal as low as possible and to reduce power consumption due to absorption of heat radiation emitted from the melt. For this reason, the bottom cover is preferably shaped such as not to substantially extend in the direction of the magnetic induction B. A preferred material for constructing the bottom cover is graphite.

Figure 9:
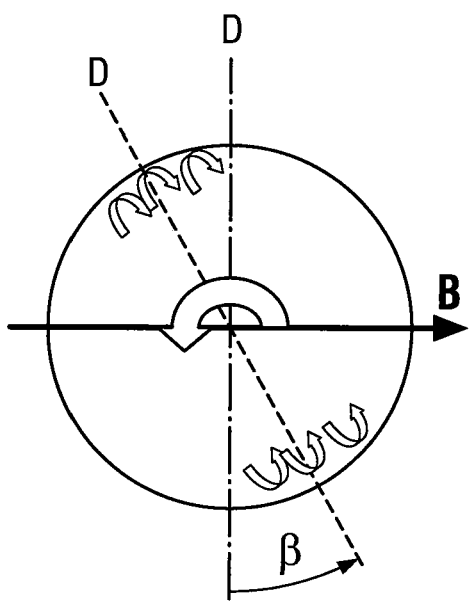
FIGS. 9 and 10 represents a view on the top of the silicon melt free surface without the crystal and the heat shield being shown.
Figure 10:
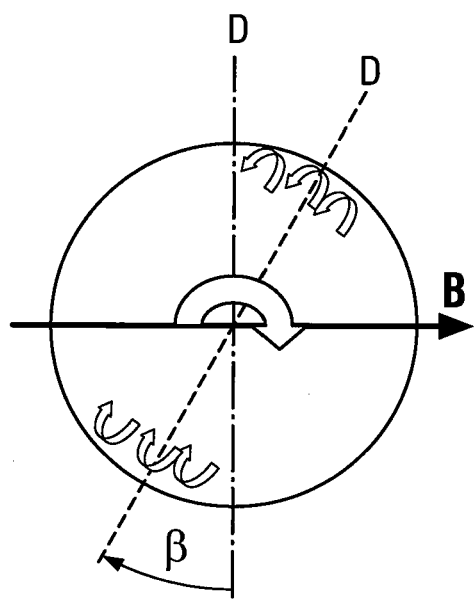

FIGS. 9 and 10 represent a view on the top of the silicon melt free surface without the crystal and the heat shield being shown. It is demonstrated that the center axis D of the sector is aligned perpendicular to the magnetic induction B or in a direction deviating by an angle β of up to ±30° from the perpendicular alignment. The algebraic sign of the angle β depends on the direction of rotation of the crucible, i.e. clockwise (FIG. 10) or counter-clockwise (FIG. 9) rotation.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method for growing a silicon single crystal from a melt, comprising
    providing the melt in a crucible;
    imposing a horizontal magnetic field on the melt having a magnetic induction B at a field center C;
    directing a gas between the silicon single crystal and a heat shield to a melt free surface, and
    controlling the gas such that the gas is forced to flow in a non-axisymmetric way with respect to a center axis M of the crucible over a region of the melt free surface which extends in a direction substantially perpendicular to the magnetic induction B.

2. The method of claim 1, wherein the region forms a sector of the melt free surface having a center angle α which is not less than 45° and not more than 135° and wherein the sector comprises a center axis D which is aligned perpendicular to the magnetic induction B or in a direction deviating up to −30° or +30° from a perpendicular alignment.

3. The method of claim 1, comprising controlling the gas to flow over the region of the melt free surface during crystal growth by turning the heat shield.

4. The method of claim 2, comprising controlling the gas to flow over the region of the melt free surface during crystal growth by turning the heat shield.

5. The method of claim 1, comprising driving gas out of the crucible in a direction substantially perpendicular to the magnetic induction B.

6. The method of claim 2, comprising driving gas out of the crucible in a direction substantially perpendicular to the magnetic induction B.

7. The method of claim 3, comprising driving gas out of the crucible in a direction substantially perpendicular to the magnetic induction B.

8. The method of claim 4, comprising driving gas out of the crucible in a direction substantially perpendicular to the magnetic induction B.

* * * * *